US012592667B2

(12) United States Patent
Lee et al.

(10) Patent No.: US 12,592,667 B2
(45) Date of Patent: Mar. 31, 2026

(54) VOLTAGE-CONTROLLED OSCILLATOR

(71) Applicant: SAMSUNG ELECTRONICS CO., LTD., Suwon-si (KR)

(72) Inventors: Dongsoo Lee, Suwon-si (KR); Daehoon Kwon, Suwon-si (KR); Dongin Kim, Suwon-si (KR); Chunsuk Kim, Suwon-si (KR); Yiju Roh, Suwon-si (KR); Inhyeok Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/781,472

(22) Filed: Jul. 23, 2024

(65) Prior Publication Data

US 2025/0015760 A1     Jan. 9, 2025

Related U.S. Application Data

(63) Continuation of application No. PCT/KR2023/000020, filed on Jan. 2, 2023.

(30) Foreign Application Priority Data

Jan. 24, 2022    (KR) ......................... 10-2022-0010143
Jan. 26, 2022    (KR) ......................... 10-2022-0011631

(51) Int. Cl.
*H03B 5/12*       (2006.01)

(52) U.S. Cl.
CPC .................................. *H03B 5/1212* (2013.01)

(58) Field of Classification Search
CPC .. H03B 5/1212; H03B 5/1215; H03B 5/1228; H03B 5/1243; H03B 5/1265; H03B 5/12
See application file for complete search history.

(56) References Cited

U.S. PATENT DOCUMENTS

| | | | |
|---|---|---|---|
| 8,773,215 B2 | 7/2014 | Sadhu et al. | |
| 9,531,323 B1 * | 12/2016 | Khalili ................. | H03B 5/1212 |
| 10,381,981 B2 | 8/2019 | Moslehi Bajestan et al. | |

(Continued)

FOREIGN PATENT DOCUMENTS

| | | |
|---|---|---|
| EP | 3139496 A1 | 3/2017 |
| KR | 100552663 B1 | 2/2006 |

(Continued)

OTHER PUBLICATIONS

Yusuke Wachi, et al., "A 28GHz Low-Phase-Noise CMOS VCO Using an Amplitude-Redistribution Technique", IEEE International Solid-State Circuits Conference, ISSCC, Feb. 6, 2008, 3 pages.

(Continued)

*Primary Examiner* — Jeffrey M Shin
(74) *Attorney, Agent, or Firm* — NIXON & VANDERHYE P.C.

(57) ABSTRACT

Disclosed are a voltage-controlled oscillator and an electronic device comprising same. A voltage-controlled oscillator according to an embodiment includes an LC tank and one or more GM cells connected to the LC tank. The LC tank includes a variable capacitor and a switched inductor connected in parallel to the variable capacitor. The GM cells include one or more decoupling capacitors inserted between the LC tank and one or more drain nodes of the GM cells.

17 Claims, 8 Drawing Sheets

(56)        References Cited

U.S. PATENT DOCUMENTS

| | | | |
|---|---|---|---|
| 10,425,038 | B2 | 9/2019 | Chiu et al. |
| 10,804,846 | B2 | 10/2020 | Zhang |
| 2009/0231003 | A1 | 9/2009 | Chen et al. |
| 2012/0286889 | A1 | 11/2012 | Park et al. |
| 2013/0063218 | A1 | 3/2013 | Sadhu et al. |
| 2017/0111009 | A1 | 4/2017 | Chiu et al. |
| 2017/0244361 | A1* | 8/2017 | Farazian .............. H03B 5/1212 |
| 2017/0257063 | A1 | 9/2017 | Martineau et al. |
| 2019/0089302 | A1* | 3/2019 | Moslehi Bajestan ........................ H03B 5/1268 |
| 2019/0372524 | A1 | 12/2019 | Zhang |
| 2020/0228059 | A1* | 7/2020 | Kenyon .............. H03B 5/1231 |

FOREIGN PATENT DOCUMENTS

| | | | |
|---|---|---|---|
| KR | 10-1562212 | B | 10/2015 |
| KR | 10-2018-0050210 | A | 5/2018 |

OTHER PUBLICATIONS

International Search Report for PCT/KR2023/000020 dated Apr. 3, 2023, 6 pages.
Written Opinion of the ISA for PCT/KR2023/000020 dated Apr. 3, 2023, 6 pages.
Office Action issued by the Korean Ministry of Intellectual Property (MOIP) on Dec. 31, 2025 for the corresponding Korean Patent Application No. 10-2022-0011631 with translation.

* cited by examiner

Vdd

M1

M2

Vtune $C_{var}$     $C_{var}$

Vout-     Vout+

L

M5     M6

300

310     320

LC tank     GM cell

VOLTAGE-CONTROLLED OSCILLATOR

CROSS-REFERENCE TO RELATED APPLICATIONS

This application is a continuation of International Application No. PCT/KR2023/000020 designating the United States, filed on Jan. 2, 2023, in the Korean Intellectual Property Receiving Office and claiming priority to Korean Patent Application Nos. 10-2022-0010143, filed on Jan. 24, 2022, and 10-2022-0011631, filed on Jan. 26, 2022, in the Korean Intellectual Property Office, the disclosures of each of which are incorporated by reference herein in their entireties.

BACKGROUND

Field

The disclosure relates to a voltage-controlled oscillator. For example, various embodiments relate to a switched-inductor voltage-controlled oscillator including a decoupled GM cell and an electronic device including the same.

Description of Related Art

A conventional transmitter and receiver used a mixer to lower a frequency and used a low-speed data converter to process a signal, but with improvement of a semiconductor process, signal processing using only a high-speed data converter has become possible. Thus, a low-noise, high-frequency phase-locked loop (PLL) is required to secure performance of the data converter, and variability in a wide range is necessary since an optimal sampling frequency needs to be set for each application frequency band. To improve performance of the PLL, a voltage-controlled oscillator (VCO), which is a core block, needs to provide multi-bands and low jitter.

A typical VCO consists of an LC resonator and a cross-coupled FET that generates a negative GM component. However, it may be difficult to provide a clock of a data converter of several Giga-Symbols per second (GSPS) with a typical VCO of a cross-coupled structure.

SUMMARY

Embodiments of the disclosure provide a voltage-controlled oscillator (VCO) that may keep a Q-factor of an LC tank high for each band by configuring inductance in a variable form.

Embodiments of the disclosure provide a core structure that may keep a Q-factor of an LC tank high by adding a decoupling capacitor between the LC tank and a drain of a GM (e.g., negative conductance) cell.

Embodiments of the disclosure provide a VCO that may be implemented in a small area using a method of changing an inductance value by switching a mutual inductance change of a transformer.

A voltage-controlled oscillator (VCO) according to an example embodiment includes: an LC tank and one or more GM cells connected to the LC tank. The LC tank includes a variable capacitor and a switched inductor connected in parallel to the variable capacitor. The GM cells include one or more decoupling capacitors inserted between the LC tank and one or more drain nodes of the GM cells.

An electronic device according to an embodiment includes a memory, a VCO that generates an oscillating VCO output signal, and a processor that controls an operation of the memory and the VCO, wherein the VCO includes an LC tank including a variable capacitor and a switched inductor connected in parallel to the variable capacitor, and one or more GM cells connected to the LC tank.

Example embodiments may provide a voltage-controlled oscillator (VCO) that may keep a Q-factor of an LC tank high for each band by configuring inductance in a variable form.

Example embodiments may provide a core structure that may keep a Q-factor of an LC tank high by adding a decoupling capacitor between the LC tank and a drain of a GM cell.

Example embodiments may provide a VCO that may be implemented in a small area using a method of changing an inductance value by switching a mutual inductance change of a transformer.

BRIEF DESCRIPTION OF DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
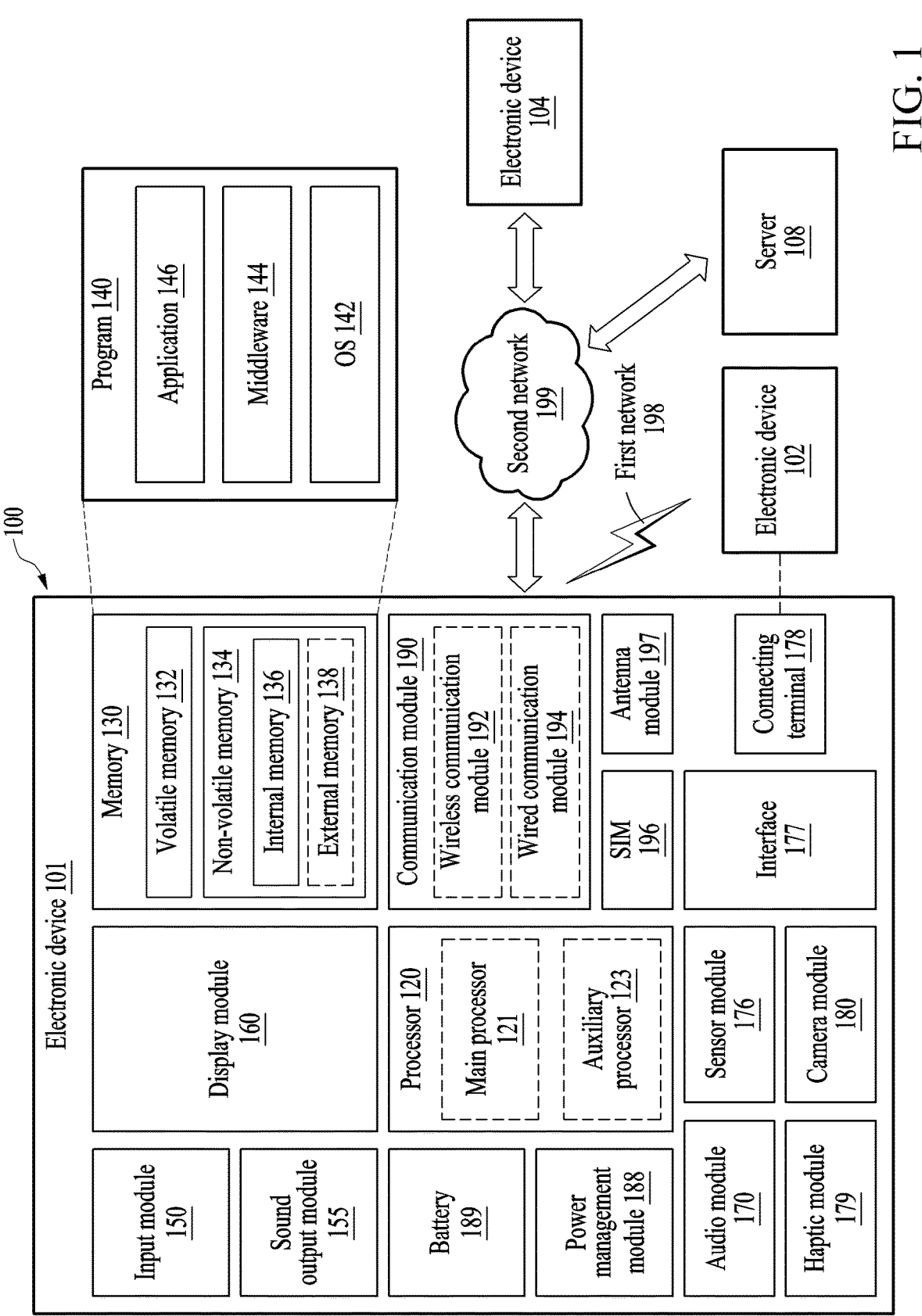
FIG. 1 is a block diagram illustrating an electronic device 101 in a network environment 100 according to various embodiments.

Hereinafter, embodiments are described in detail with reference to the accompanying drawings. When describing the embodiments with reference to the accompanying drawings, like reference numerals refer to like components and a repeated description related thereto is omitted.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or communicate with at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, a memory 130, an input module 150, a sound output module 155, a display module 160, an audio module 170, and a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the connecting terminal 178) of the above components may be omitted from the electronic device 101, or one or more other components may be added to the electronic device 101. In some embodiments, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. According to an embodiment, as at least a part of data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121 or to be specialized for a specified function. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., executing an application). According to an embodiment, the auxiliary processor 123 (e.g., an ISP or a CP) may be implemented as a portion of another component (e.g., the camera module 180 or the communication module 190) that is functionally related to the auxiliary processor 123. According to an embodiment, the auxiliary processor 123 (e.g., an NPU) may include a hardware structure specialized for artificial intelligence model processing. An artificial intelligence model may be generated by machine learning. Such learning may be performed, for example, by the electronic device 101 in which the artificial intelligence model is executed, or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), a bidirectional recurrent deep neural network (BRDNN), a deep Q-network, or a combination of two or more thereof, but is not limited thereto. The artificial intelligence model may additionally or alternatively include a software structure other than the hardware structure.

The memory 130 may store various pieces of data used by at least one component (e.g., the processor 120 or the sensor module 176) of the electronic device 101. The various pieces of data may include, for example, software (e.g., the program 140) and input data or output data for a command related thereto. The memory 130 may include the volatile memory 132 or the non-volatile memory 134.

The program 140 may be stored as software in the memory 130, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing a record. The receiver may be used to receive an incoming call. According to an embodiment, the receiver may be implemented separately from the speaker or as a part of the speaker.

The display module 160 may visually provide information to the outside (e.g., a user) of the electronic device 101. The display module 160 may include, for example, a display, a hologram device, or a projector and control circuitry to control a corresponding one of the display, the hologram device, and the projector. According to an embodiment, the display device 160 may include a touch sensor adapted to sense a touch, or a pressure sensor adapted to measure an intensity of a force incurred by the touch. According to an embodiment, the display module 160 may include a screen of which the size exposed to the outside of the display module 160 changes. For example, the display module 160 may be an expandable display, such as a foldable display, a rollable display, and a slidable display. For example, the expandable display may be implemented through a flexible display.

The audio module 170 may convert a sound into an electrical signal or vice versa. According to an embodiment, the audio module 170 may obtain the sound via the input module 150 or output the sound via the sound output module 155 or an external electronic device (e.g., an electronic device 102 such as a speaker or headphones) directly or wirelessly connected to the electronic device 101.

The sensor module 176 may detect an operational state (e.g., power or temperature) of the electronic device 101 or an environmental state (e.g., a state of a user) external to the electronic device 101, and generate an electric signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., by wire) or wirelessly. According to an embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electric signal into a mechanical stimulus (e.g., a vibration or a movement) or an electrical stimulus which may be recognized by a user via his or her tactile sensation or kinesthetic sensation. According to an embodiment, the haptic module 179 may include, for example, a motor, a piezoelectric element, or an electric stimulator.

The camera module 180 may capture a still image and moving images. According to an embodiment, the camera module 180 may include one or more lenses, image sensors, ISPs, or flashes.

The power management module 188 may manage power supplied to the electronic device 101. According to an embodiment, the power management module 188 may be implemented as, for example, at least a part of a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CPs that are operable independently of the processor 120 (e.g., an AP) and that support direct (e.g., wired) communication or wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module, or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., a LAN or a wide area network (WAN))). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network, and next-generation communication technology, for example, new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), an array antenna, analog beam-forming, or a large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or power may be transmitted or received between the communication module 190 and the external electronic device via the at least one selected antenna. According to an embodiment, another component (e.g., a radio frequency integrated circuit (RFIC)) other than the radiating element may be additionally formed as a part of the antenna module 197.

According to an embodiment, the antenna module 197 may form a mm Wave antenna module. According to an embodiment, the mmWave antenna module may include a PCB, an RFIC disposed on a first surface (e.g., a bottom surface) of the PCB or adjacent to the first surface and capable of supporting a designated high-frequency band (e.g., the mm Wave band), and a plurality of antennas (e.g., array antennas) disposed on a second surface (e.g., a top or a side surface) of the PCB, or adjacent to the second surface and capable of transmitting or receiving signals in the designated high-frequency band.

At least some of the above-described components may be coupled mutually and communicate signals (e.g., commands or data) therebetween via an inter-peripheral communication scheme (e.g., a bus, a general purpose input and output (GPIO), a serial peripheral interface (SPI), or a mobile industry processor interface (MIPI)).

According to an embodiment, commands or data may be transmitted or received between the electronic device 101 and the external electronic device 104 via the server 108 coupled with the second network 199. Each of the external electronic devices 102 or 104 may be a device of the same type as or a different type from the electronic device 101. According to an embodiment, all or some of operations to be executed by the electronic device 101 may be executed at one or more external electronic devices (e.g., the external devices 102 and 104, and the server 108). For example, if the electronic device 101 needs to perform a function or a service automatically, or in response to a request from a user or another device, the electronic device 101, instead of, or in addition to, executing the function or the service, may request one or more external electronic devices to perform at least portion of the function or the service. The one or more external electronic devices receiving the request may perform the at least part of the function or service, or an additional function or an additional service related to the request and may transfer a result of the performance to the electronic device 101. The electronic device 101 may provide the result, with or without further processing the result, as at least part of a response to the request. To this end, cloud computing, distributed computing, mobile edge computing (MEC), or client-server computing technology may be used, for example. The electronic device 101 may provide ultra low-latency services using, e.g., distributed computing or MEC. In an embodiment, the external electronic device 104 may include an Internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., a smart home, a smart city, a smart car, or healthcare) based on 5G communication technology or IoT-related technology.

A voltage-controlled oscillator (VCO) according to an embodiment may have an advantage in improving jitter and may implement multi-bands in a small area. Before describing a structure of the VCO according to an embodiment in detail, for convenience of understanding, a structure of a conventional VCO is described first.

Figure 2:
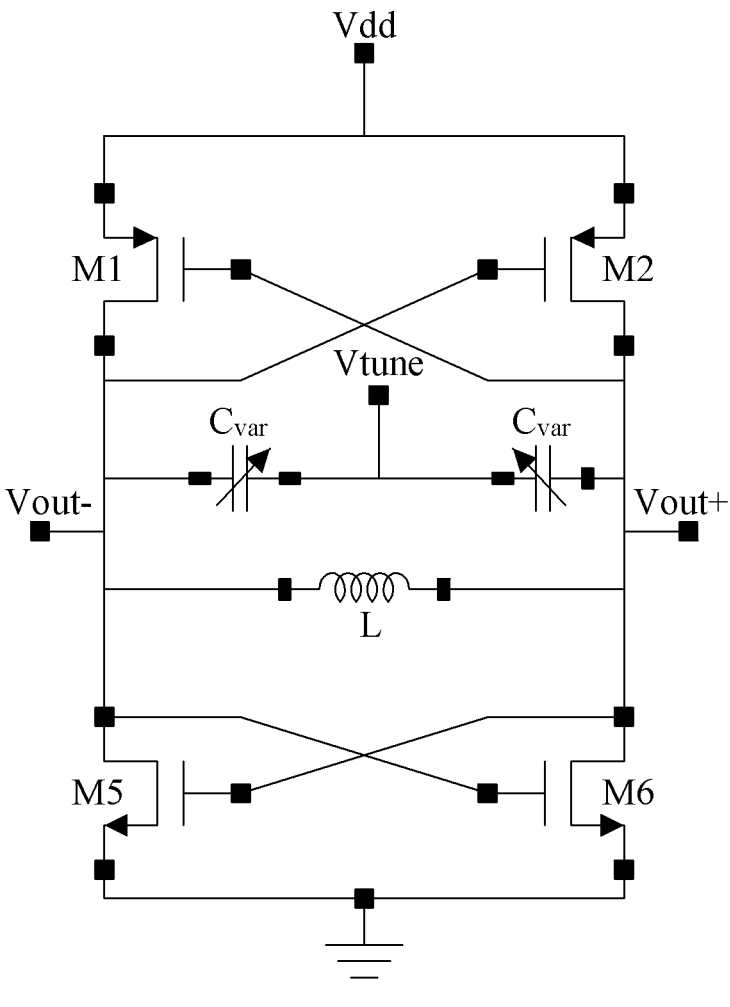
FIG. 2 is a diagram illustrating a structure of a conventional voltage-controlled oscillator (VCO).

FIG. 2 is a diagram illustrating a structure of a conventional VCO.

Referring to FIG. 2, the VCO may include cross-coupled transistors M1, M2, M5, and M6, a varactor diode $C_{var}$ providing variable capacitance, and an inductor L.

The VCO may generate oscillating VCO output signals $V_{OUT-}$ and $V_{OUT+}$. A frequency of the oscillating VCO output signals may be determined by a capacitance value of the varactor diode $C_{var}$ and an inductance value of the inductor L, and a capacitance value of the varactor diode $C_{var}$ may be controlled by a control signal $V_{TUNE}$.

The VCO may not be capable of maintaining a Q factor of an LC tank over multi-bands and may thus have a performance limitation as a low-noise, high-frequency VCO.

Furthermore, since it may be difficult to implement multi-bands with a single VCO, there may be a limitation that two identical first VCOs need to be used to implement multi-bands.

Figure 3:
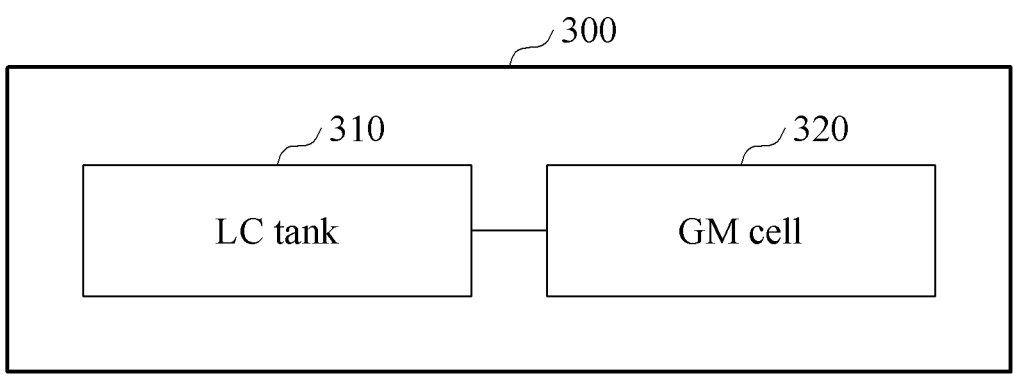
FIG. 3 is a block diagram illustrating a VCO according to an embodiment.

FIG. 3 is a block diagram illustrating a VCO according to an embodiment.

Referring to FIG. 3, the VCO according to an embodiment may include an LC tank 310 and at least one GM cell 320 connected to the LC tank 310.

The VCO according to an embodiment may operate as a frequency source that generates a specific frequency source, and the LC tank 310 according to an embodiment may be a frequency selection circuit that is capable of selecting a desired frequency and oscillating. The LC tank 310 according to an embodiment may be a circuit capable of storing energy including an inductor and a capacitor and may also be referred to as an LC tank circuit, a tank circuit, or a parallel resonant circuit.

An oscillation frequency of the LC tank 310 according to an embodiment may be determined based on an inductance value of the inductor and a capacitance value of the capacitor. The LC tank 310 according to an embodiment may adjust the inductance value of the inductor and the capacitance value of the capacitor to select a desired oscillation frequency (hereinafter, the oscillation frequency may also be referred to as a VCO frequency or an operating frequency).

More specifically, the LC tank 310 according to an embodiment may adjust the capacitance value by using a variable capacitor. For example, the LC tank 310 may control the capacitance value by using a varactor, which may be a variable-capacitance diode that is capable of varying capacitance depending on voltage. That is, the LC tank 310 may change the capacitance value of the varactor by controlling control voltage, thereby setting a desired oscillation frequency value.

Furthermore, the LC tank 310 according to an embodiment may also control the inductance value by using a switched inductor. An operating method of a switched inductor according to an embodiment is described in detail below with reference to FIG. 4 and FIGS. 7A and 7B.

The GM cell 320 according to an embodiment may be a decoupled GM cell. More specifically, the GM cell 320 according to an embodiment may include a decoupling capacitor inserted between the LC tank 310 and a drain of the GM cell 320 and may thus separate the LC tank 310 and the drain of the GM cell 320, thereby preventing Q factor degradation of the LC tank 310. A specific structure of the GM cell 320 according to an embodiment is described in detail below with reference to FIG. 5.

Figure 4:
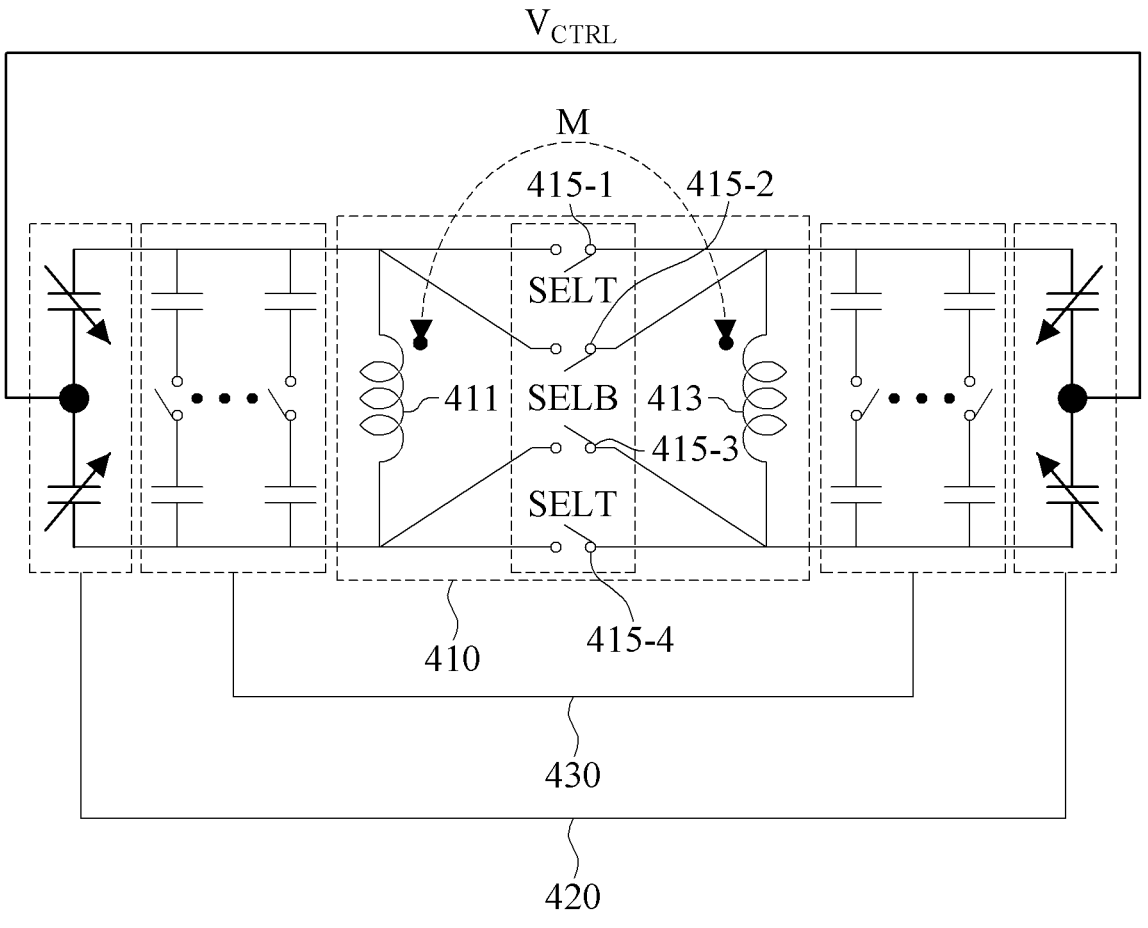
FIG. 4 is a diagram illustrating an example of an LC tank according to an embodiment.

FIG. 4 is a diagram illustrating an example of an LC tank according to an embodiment.

An LC tank 400 of FIG. 4 may be the LC tank 310 described with reference to FIG. 3. The description given with reference to FIG. 3 may be equally applied to FIG. 4, and any repeated description may thus be omitted.

Referring to FIG. 4, the LC tank 400 according to an embodiment may include a switched inductor 410 and a variable capacitor 420. According to an embodiment, the switched inductor 410 and the variable capacitor 420 may be connected in parallel.

The LC tank 400 according to an embodiment may further include a capacitor bank 430. The capacitor bank 430 according to an embodiment may be connected in parallel to the variable capacitor 420 and the switched inductor 410. The capacitor bank 430 may include a plurality of capacitors that may be enabled/disabled via a switch, and an optimized frequency value may be found by initially finding a frequency change according to a process or voltage change through the capacitor bank 430. A capacitance value of the capacitor bank 430 according to an embodiment may be adjusted based on a control signal received from automatic frequency calibration (AFC). The AFC according to an embodiment may adjust an effective capacitance value of a capacitor bank by switching the capacitor bank.

The variable capacitor 420 according to an embodiment may be a varactor, in which case the capacitance value may be adjusted by control voltage VCTRL. The variable capacitor 420 according to an embodiment may perform more precise frequency control through a phase-locked loop (PLL) operation at a frequency optimized through the capacitor bank 430.

The LC tank 400 according to an embodiment may control not only the capacitance value but also an inductance value by using the switched inductor 410, thereby maintaining a Q factor of the LC tank 400 high for each frequency band.

The switched inductor 410 according to an embodiment may include a first inductor 411, a second inductor 413, and a plurality of switches 415-1 to 415-4. A controller (not shown) according to an embodiment may adjust an effective inductance value of the switched inductor by controlling each of the plurality of switches. The controller according to an embodiment may operate in a plurality of modes to adjust the VCO frequency to a plurality of bands by varying the effective inductance value.

The controller according to an embodiment may synchronize and adjust the first switch 415-1 and the fourth switch 415-4 and may synchronize and adjust the second switch 415-2 and the third switch 415-3.

The controller according to an embodiment may control the LC tank 400 in two types of modes. For example, the controller may control the first switch 415-1 and the fourth switch 415-4 to be closed and the second switch 415-2 and the third switch 415-3 to be open, and the corresponding control state may be referred to as a first mode (or a high band mode).

Alternatively, the controller may control the first switch 415-1 and the fourth switch 415-4 to be open and the second switch 415-2 and the third switch 415-3 to be closed, and the corresponding control state may be referred to as a second mode (or a low band mode).

More specifically, the controller may control a direction of mutual inductance between the inductor 411 and the second inductor 413 by controlling the plurality of switches 415-1 to 415-4. For example, the controller may control the plurality of switches 415-1 to 415-4 in the first mode and may thus control the mutual inductance in a positive direction by coupling the first inductor 411 and the second inductor 413 in phase.

Alternatively, the controller may control the plurality of switches 415-1 to 415-4 in the second mode and may thus control the mutual inductance in a negative direction by coupling the first inductor 411 and the second inductor 413 in antiphase.

Figure 5:
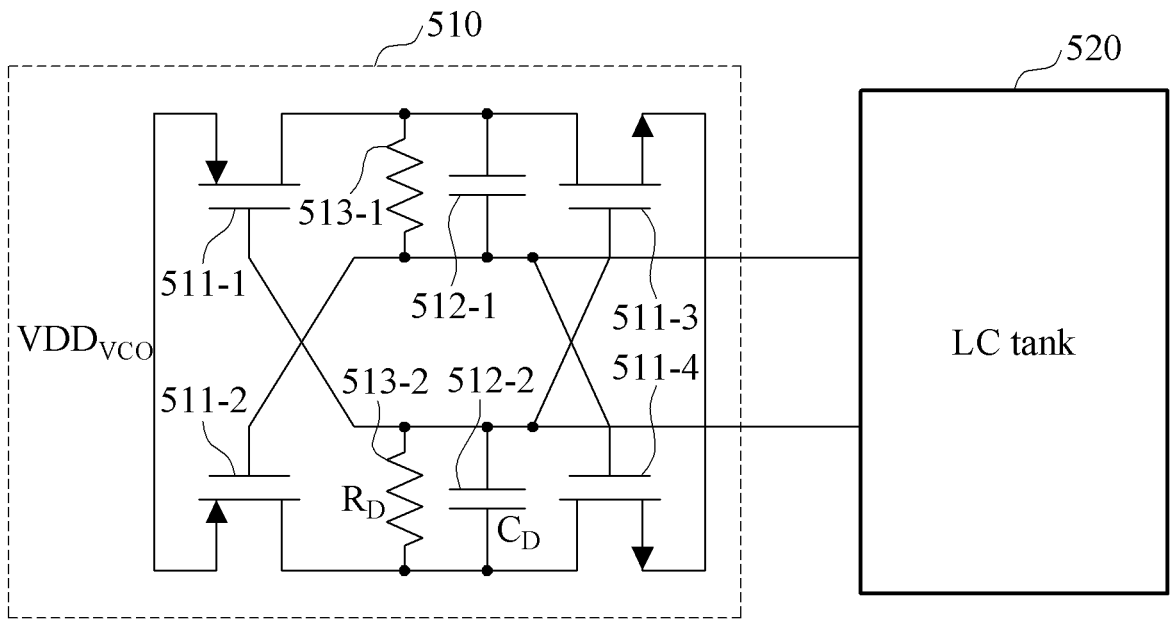
FIG. 5 is a diagram illustrating a structure of a GM cell according to an embodiment.

FIG. 5 is a diagram illustrating a structure of a GM cell according to an embodiment.

Referring to FIG. 5, a VCO according to an embodiment may include a GM cell 510 and an LC tank 520.

The GM cell 510 of FIG. 5 may be the GM cell 320 described with reference to FIG. 3, and the LC tank 520 of FIG. 5 may be the LC tank 310 and the LC tank 400 described with reference to FIGS. 3 and 4. The descriptions given with reference to FIGS. 3 and 4 may be equally applied to FIG. 5, and any repeated description may thus be omitted.

In FIG. 5, for convenience of explanation, the VCO is illustrated as including one GM cell 320, but the VCO may include a plurality of GM cells.

The GM cell 510 according to an embodiment may include a plurality of transistors 511-1 to 511-4 and decoupling capacitors 512-1 and 512-2.

The transistors M1 and M2 of a first VCO 210 of FIG. 2 may be cross-coupled to each other (a gate of M1 may be coupled to a drain of M2, and a gate of M2 may be coupled to a drain of M1), whereas the transistors 511-1 to 511-4 of the GM cell 510 according to an embodiment of FIG. 5 may be decoupled from each other.

More specifically, a decoupling capacitor 512-1 according to an embodiment may be inserted between a gate node of the transistor 511-2 and the transistor 511-4 and a drain node of the transistor 511-1 and the transistor 511-3. In addition, the decoupling capacitor 512-2 according to an embodiment may be inserted between a drain node of the transistor 511-2 and the transistor 511-4 and a gate node of the transistor 511-1 and the transistor 511-3. In this case, the LC tank 520 may be connected to the gate node of the transistor 511-2 and the transistor 511-4 and the gate node of the transistor 511-1 and the transistor 511-3. Through this, the LC tank 520 and the drain of the GM cell 510 may be separated, thereby preventing Q factor degradation of the LC tank 520.

Furthermore, the GM cell 510 according to an embodiment may further include a plurality of resistors 513-1 and 513-2. The resistor 513-1 according to an embodiment may be connected in parallel with the decoupling capacitor 512-1, and the resistor 513-2 according to an embodiment may be connected in parallel with the decoupling capacitor 512-2.

The resistor 513-1 according to an embodiment may provide bias voltage to gates of the transistor 511-2 and the transistor 511-4, and the resistor 513-2 may provide bias voltage to gates of the transistor 511-1 and the transistor 511-3. Through this, the resistors 513-1 and 513-2 according to an embodiment may prevent a floating phenomenon. Hereinafter, the resistors 513-1 and 513-2 according to an embodiment may be referred to as a first resistor.

Figure 6:
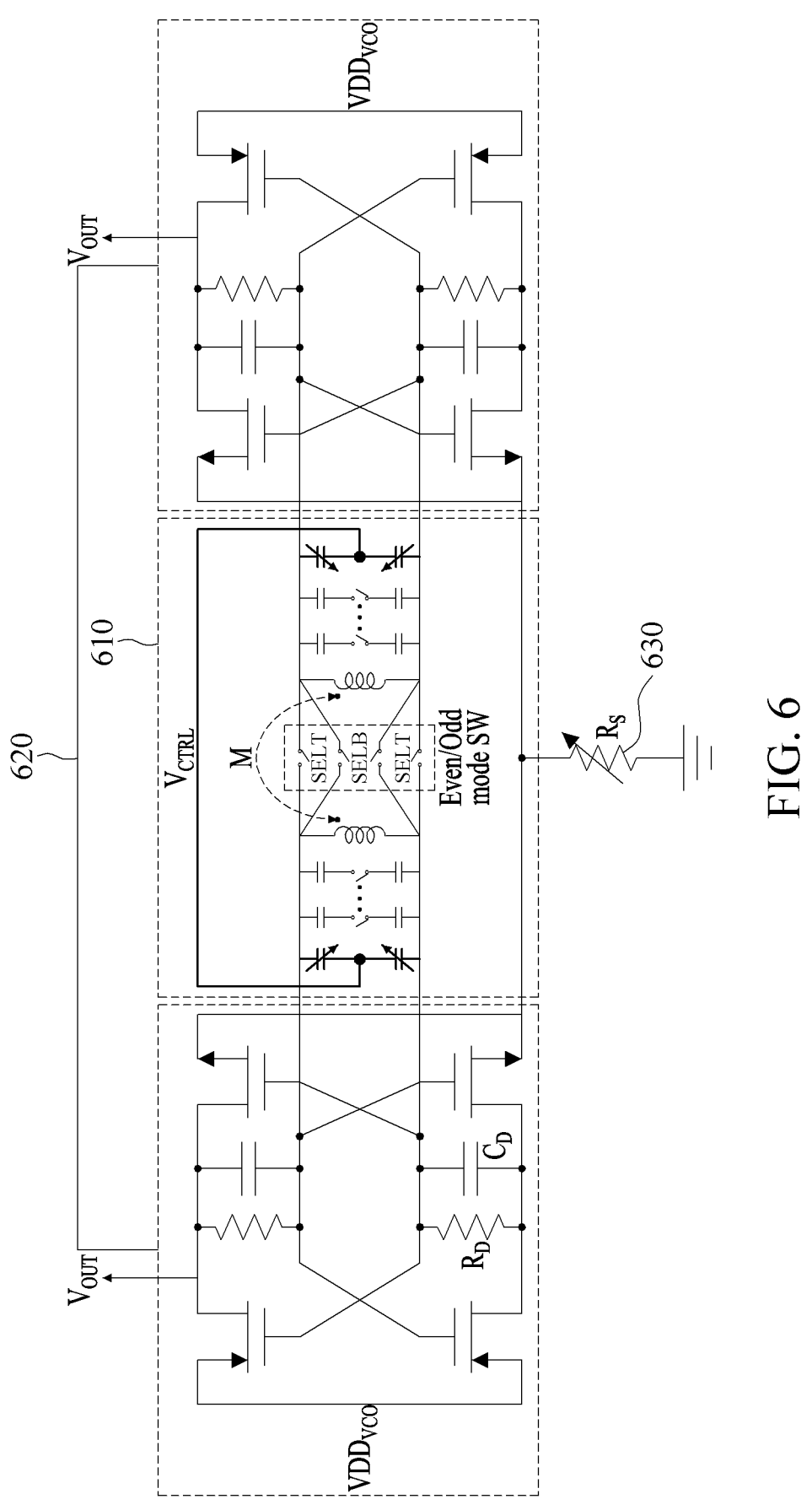
FIG. 6 is a diagram illustrating an example of a VCO according to an embodiment.

FIG. 6 is a diagram illustrating an example of a VCO according to an embodiment.

Referring to FIG. 6, a VCO according to an embodiment may include an LC tank 610 and a GM cell 620.

The GM cell 620 of FIG. 6 may be the GM cell 320 and the GM cell 510 described with reference to FIGS. 3 and 5, and the LC tank 610 of FIG. 6 may be the LC tank 310, the LC tank 400, and the LC tank 520 described with reference to FIGS. 3 to 5. The descriptions given with reference to FIGS. 3 to 5 may be equally applied to FIG. 6, and any repeated description may thus be omitted.

The VCO according to an embodiment may further include a resistor 630 connected to a source node of the GM cell 620. The resistor 630 according to an embodiment may be a variable resistor, and the VCO may reduce substrate noise through the resistor 630 and optimize performance by controlling an amount of current. The resistor 630 according to an embodiment may be referred to as a second resistor.

The LC tank 610 of the VCO according to an embodiment may adjust an inductance value using a switched inductor and may maintain a Q factor of the LC tank 610 high by adding a decoupling capacitor between the LC tank 610 and a drain of the GM cell 620.

Figure 7:
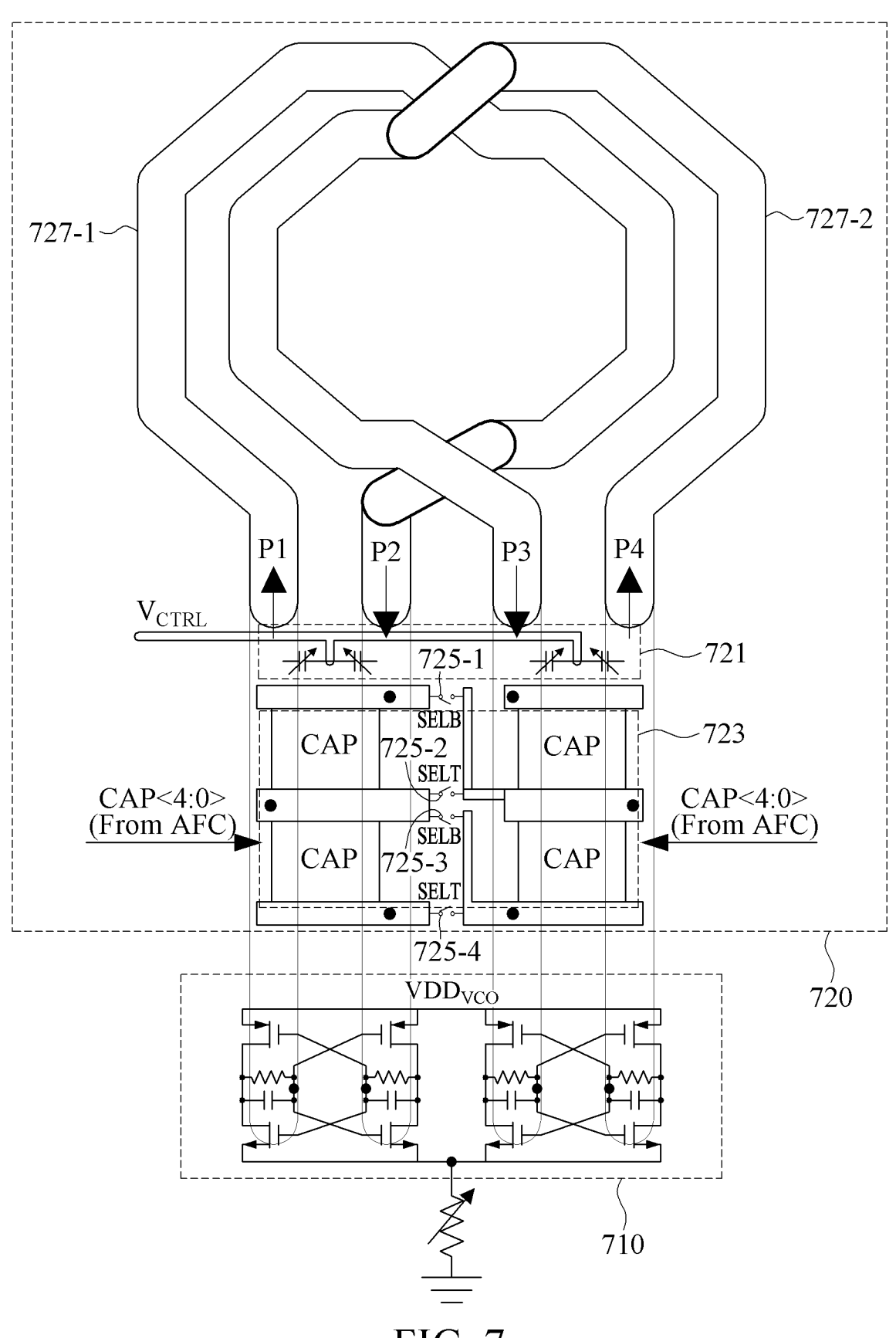
FIG. 7 is a diagram illustrating a method of controlling an LC tank according to a plurality of modes according to an embodiment.

FIG. 7 is a diagram illustrating a method of controlling an LC tank according to a plurality of modes according to an embodiment.

The descriptions given with reference to FIGS. 3 to 6 may be equally applied to FIG. 7, and any repeated description may thus be omitted.

Referring to FIG. 7, a VCO according to an embodiment may include a GM cell 710 and an LC tank 720, and the LC tank 720 may include a capacitor bank 721, a variable capacitor 723, a plurality of switches 725-1 to 725-4, and inductors 727-1 and 727-2.

A controller (not shown) according to an embodiment may control the LC tank in two types of modes by controlling each of the plurality of switches 725-1 to 725-4. The controller according to an embodiment may adjust an effective inductance value of a switched inductor. The controller according to an embodiment may operate in a plurality of modes to adjust the VCO frequency to a plurality of bands by varying the effective inductance value.

More specifically, the controller may control the plurality of switches 725-1 to 725-4 in a first mode (wherein the first switch 725-1 and the fourth switch 725-4 may be closed, and the second switch 725-2 and the third switch 725-3 may be open).

The controller according to an embodiment may control the plurality of switches 725-1 to 725-4 in the first mode and may thus control a mutual inductance in a positive direction by coupling the first inductor 727-1 and the second inductor 727-2 in phase.

The controller according to an embodiment may control the plurality of switches in the first mode and may thus adjust an effective inductance value to a value obtained by adding a mutual inductance value to a self-inductance value of each of the plurality of inductors.

The controller may control the plurality of switches 725-1 to 725-4 in a second mode (wherein the first switch 725-1 and the fourth switch 725-4 may be open, and the second switch 725-2 and the third switch 725-3 may be closed).

The controller according to an embodiment may control the plurality of switches 725-1 to 725-4 in the second mode and may thus control the mutual inductance in a negative direction by coupling the first inductor 727-1 and the second inductor 727-2 in antiphase.

The controller according to an embodiment may control the plurality of switches in the second mode and may thus adjust the effective inductance value to a value obtained by subtracting the mutual inductance value from the self-inductance value of each of the plurality of inductors.

Through this, the VCO according to an embodiment may have an advantage in improving jitter and may implement multi-bands in a small area.

Figure 8:
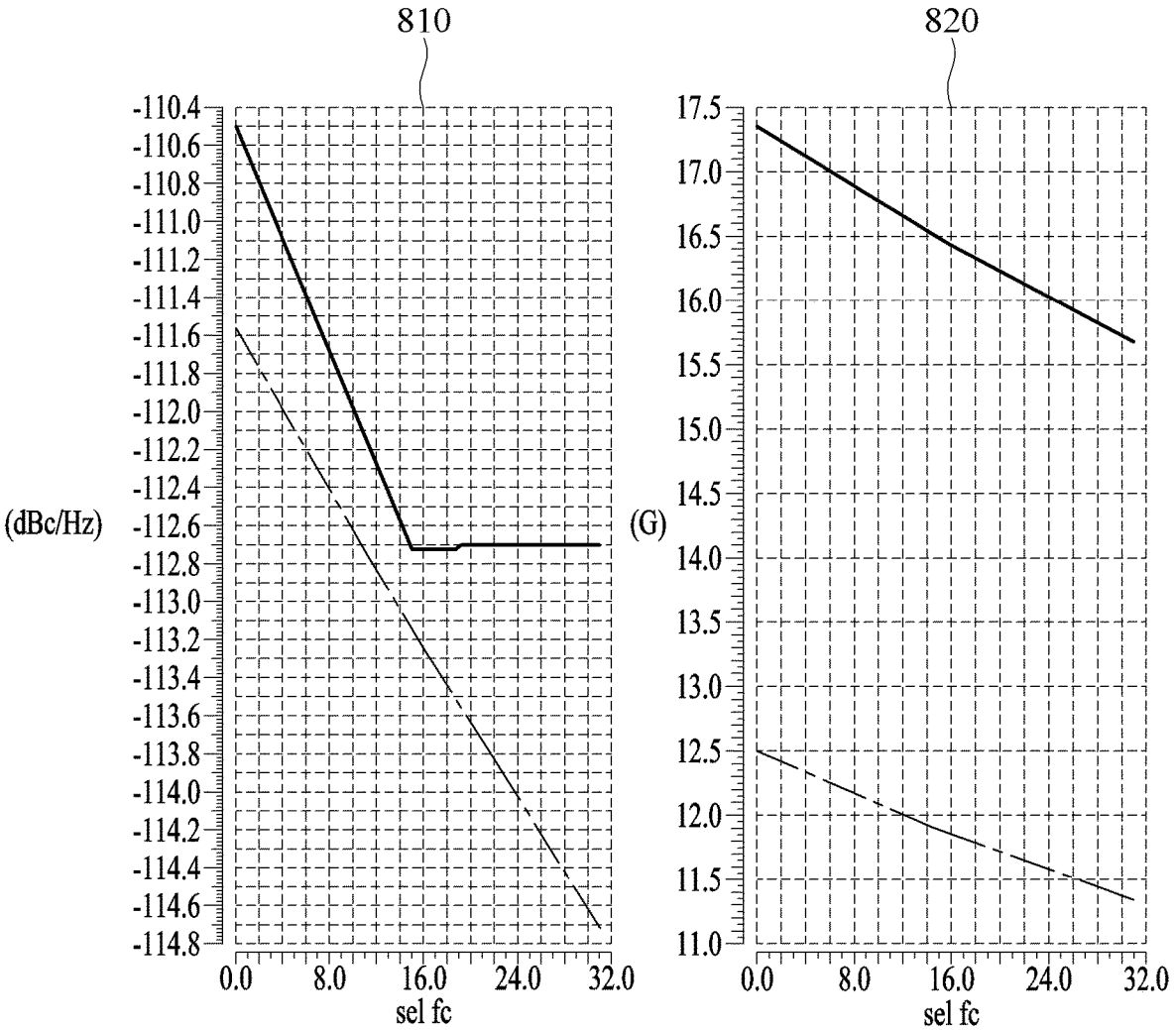
FIG. 8 is a graph illustrating a simulation result of a VCO according to an embodiment.

FIG. 8 is a graph illustrating a simulation result of a VCO according to an embodiment.

Referring to FIG. 8, a graph 810 may be a graph illustrating phase noise according to a mode switch. The x-axis of the graph 810 may represent a code value of AFC, and the y-axis may represent a phase noise value.

A graph 820 may be a graph illustrating a frequency change according to the mode switch. The x-axis of the graph 820 may represent the code value of the AFC, and the y-axis may represent a VCO frequency value. Referring to the graph 820, the VCO according to an embodiment may provide two bands. The VCO may provide a frequency band from 15.668 GHz to 17.332 GHz when operating in a first mode and may provide a frequency band from 11.328 GHz to 12.473 GHz when operating in a second mode.

Figure 9:
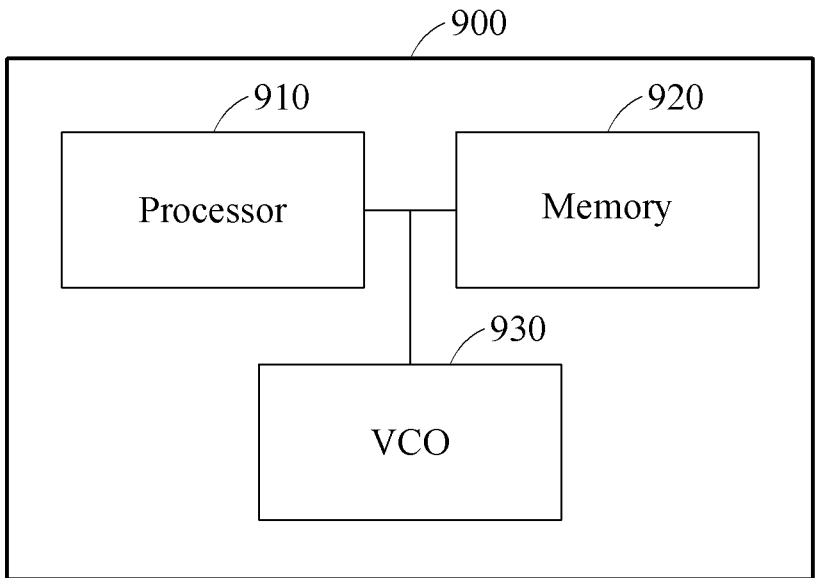
FIG. 9 is a block diagram illustrating an electronic device according to an embodiment.

FIG. 9 is a block diagram illustrating an electronic device according to an embodiment.

Referring to FIG. 9, an electronic device 900 according to an embodiment may include a processor 910, a memory 920, and a VCO 930. The processor 910, the memory 920, and the VCO 930 may communicate with each other via a communication bus 905.

The VCO 930 according to an embodiment may include the VCO described with reference to FIGS. 3 to 7.

The processor 910 according to an embodiment may control an operation of the memory 920 and the VCO 930.

The memory 920 according to an embodiment may be a volatile memory or a non-volatile memory, and the processor 910 may execute a program and control the electronic device 900. Program code to be executed by the processor 910 may be stored in the memory 920.

The electronic device 900 may be connected to an external device (e.g., a personal computer or a network) through an input/output device (not shown) and may exchange data with the external device. The electronic device 900 may be mounted on various computing devices and/or systems such as a smartphone, a tablet computer, a laptop computer, a desktop computer, a television, a wearable device, a security system, a smart home system, and the like.

The electronic device 900 according to an embodiment may be an integral electronic device including the VCO 930. For example, the electronic device 900 may include a transceiver, a data converter, and a PLL.

According to an embodiment, a method according to various embodiments of the present disclosure may be included and provided in a computer program product. The computer program product may be traded as a product between a seller and a buyer. The computer program product may be distributed in the form of a machine-readable storage medium (e.g., a compact disc read-only memory (CD-ROM)), or be distributed (e.g., downloaded or uploaded) online via an application store (e.g., PlayStore™), or between two user devices (e.g., smartphones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. A voltage-controlled oscillator (VCO) comprising:
an LC tank; and
one or more GM cells connected to the LC tank,
wherein the LC tank comprises:
    a variable capacitor; and
    a switched inductor connected in parallel to the variable capacitor, and
wherein the one or more GM cells comprise:
    one or more decoupling capacitors inserted between the LC tank and one or more drain nodes of the GM cells; and
wherein the LC tank is connected to one or more gate nodes of the GM cells.

2. The VCO of claim 1, wherein the switched inductor comprises:
a plurality of inductors; and
a plurality of switches inserted between the plurality of inductors.

3. The VCO of claim 1, wherein the switched inductor is configured to operate in a plurality of modes and to adjust a VCO frequency to a plurality of bands by varying an effective inductance value.

4. The VCO of claim 2, further comprising:
a controller configured to adjust an effective inductance value of the switched inductor by controlling each of the plurality of switches.

5. The VCO of claim 4, wherein the controller is configured to:
adjust a direction of mutual inductance between the plurality of inductors by controlling each of the plurality of switches.

6. The VCO of claim 4, wherein the controller is configured to:
couple the plurality of inductors in phase by controlling the plurality of switches in a first mode.

7. The VCO of claim 4, wherein the controller is configured to:
control the plurality of switches in a first mode and adjust the effective inductance value to a value obtained by subtracting a mutual inductance value from a self-inductance value of each of the plurality of inductors.

8. The VCO of claim 4, wherein the controller is configured to:
couple the plurality of inductors in antiphase by controlling the plurality of switches in a second mode.

9. The VCO of claim 4, wherein the controller is configured to:
control the plurality of switches in a second mode and adjust the effective inductance value to a value obtained by adding the mutual inductance value to the self-inductance value of each of the plurality of inductors.

10. The VCO of claim 1, wherein the LC tank further comprise:
a capacitor bank connected in parallel to the variable capacitor and the switched inductor.

11. The VCO of claim 10, wherein a capacitance value of the capacitor bank is adjusted based on a control signal received from automatic frequency calibration (AFC).

12. The VCO of claim 1, wherein the GM cells further comprise:
one or more first resistors connected in parallel to the decoupling capacitors and configured to provide bias voltage to one or more gates of the GM cells.

13. The VCO of claim 1, further comprising:
a second resistor connected to a source node of the GM cell and configured to control an amount of current.

14. The VCO of claim 1, wherein the at least one of the one or more GM cells comprises:
a first decoupling capacitor comprising a first decoupling capacitor first terminal directly connected to a drain node of a first transistor of the at least one or more GM cells and a first decoupling capacitor second terminal connected to the LC tank and to a gate node of a second transistor of the at least one or more GM cells, the first decoupling capacitor first terminal also being directly connected to a drain electrode of a third transistor of the at least one or more GM cells;
a second decoupling capacitor comprising a second decoupling capacitor first terminal directly connected to a drain node of the second transistor of the at least one or more GM cells and a second decoupling capacitor second terminal connected to the LC tank and to the gate node of the first transistor of the at least one or more GM cells, the second decoupling capacitor first terminal also being directly connected to a drain electrode of a fourth transistor of the at least one or more GM cells.

15. The VCO of claim 1, wherein the variable capacitor comprise:
a varactor.

16. An electronic device comprising:
a memory;
a voltage-controlled oscillator (VCO) configured to generate an oscillating VCO output signal; and
a processor comprising processor circuitry configured to control an operation of the memory and the VCO,
wherein the VCO comprises:
an LC tank comprising a variable capacitor and a switched inductor connected in parallel to the variable capacitor; and
one or more GM cells connected to the LC tank,
wherein the GM cells comprise:
one or more decoupling capacitors inserted between the LC tank and one or more drain nodes of the GM cells,
wherein the LC tank is connected to one or more gate nodes of the GM cells.

17. The electronic device of claim 16, wherein the at least one of the one or more GM cells comprises:
a first decoupling capacitor comprising a first decoupling capacitor first terminal directly connected to a drain node of a first transistor of the at least one or more GM cells and a first decoupling capacitor second terminal connected to the LC tank and to a gate node of a second transistor of the at least one or more GM cells, the first decoupling capacitor first terminal also being directly connected to a drain electrode of a third transistor of the at least one or more GM cells;
a second decoupling capacitor comprising a second decoupling capacitor first terminal directly connected to a drain node of the second transistor of the at least one or more GM cells and a second decoupling capacitor second terminal connected to the LC tank and to the gate node of the first transistor of the at least one or more GM cells, the second decoupling capacitor first terminal also being directly connected to a drain electrode of a fourth transistor of the at least one or more GM cells.

* * * * *